United States Patent
Cho

(10) Patent No.: US 7,825,464 B2
(45) Date of Patent: Nov. 2, 2010

(54) SEMICONDUCTOR DEVICE WITH RECESSED ACTIVE REGION AND GATE IN A GROOVE

(75) Inventor: Gyu Seog Cho, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 291 days.

(21) Appl. No.: 12/020,651

(22) Filed: Jan. 28, 2008

(65) Prior Publication Data
US 2009/0159988 A1    Jun. 25, 2009

(30) Foreign Application Priority Data
Dec. 20, 2007    (KR) .................. 10-2007-0134035

(51) Int. Cl.
*H01L 29/78* (2006.01)
(52) U.S. Cl. ............................. 257/332; 257/E29.26
(58) Field of Classification Search ............... 257/331, 257/332, E29.257, E29.26
See application file for complete search history.

(56) References Cited

U.S. PATENT DOCUMENTS

| 6,498,071 | B2 * | 12/2002 | Hijzen et al. ............... 438/425 |
| 7,344,943 | B2 * | 3/2008 | Herrick et al. ............... 438/259 |
| 7,378,320 | B2 * | 5/2008 | Seo et al. ..................... 438/286 |
| 2003/0075759 | A1 * | 4/2003 | Kawano et al. ............. 257/330 |
| 2007/0007571 | A1 * | 1/2007 | Lindsay et al. ............. 257/306 |
| 2007/0296031 | A1 * | 12/2007 | Tanaka ....................... 257/330 |

FOREIGN PATENT DOCUMENTS

| KR | 1020040008478 A | 1/2004 |
| KR | 10-0498476 B1 | 7/2005 |
| KR | 1020060080718 A | 7/2006 |
| KR | 1020070114463 A | 12/2007 |

* cited by examiner

*Primary Examiner*—Jerome Jackson, Jr.
*Assistant Examiner*—Paul A Budd
(74) *Attorney, Agent, or Firm*—Ladas & Parry LLP

(57) ABSTRACT

A semiconductor device and a method for manufacturing the same are disclosed. The disclosed semiconductor device includes a semiconductor substrate having a device isolation structure for delimiting an active region, the active region being recessed and grooves being defined in channel forming areas of the active region; gates formed in and over the grooves; gate spacers formed on both sidewalls of the gates over portions of the recessed active region which are positioned on both sides of the gates; an LDD region formed in the active region under the gate spacers; junction areas formed in the active region on both sides of the gates including the gate spacers; and landing plugs formed on the junction areas.

5 Claims, 4 Drawing Sheets

SEMICONDUCTOR DEVICE WITH RECESSED ACTIVE REGION AND GATE IN A GROOVE

CROSS-REFERENCE TO RELATED APPLICATIONS

The present application claims priority to Korean patent application number 10-2007-0134035 filed on Dec. 20, 2007, which is incorporated herein by reference in its entirety.

BACKGROUND OF THE INVENTION

The present invention relates to a method for manufacturing a semiconductor device, and more particularly, to a semiconductor device which can reduce gate-induced drain leakage (GIDL) and parasitic capacitance and a method for manufacturing the same.

As the integration level of a semiconductor device increases, the sizes of the patterns formed in a semiconductor integrated circuit decrease. In conformity with this trend, various structures and process techniques for preventing the characteristics of a semiconductor device from being degraded have been developed and adopted.

For example, as a semiconductor device is highly integrated, the width of a gate decreases. Due to this, as a channel length decreases, a short channel effect, in which a threshold voltage abruptly decreases, results. In order to prevent the short channel effect, a lightly doped drain (LDD) region is formed. In this regard, in the case of a semiconductor device having a sub-100 nm level, since a channel length further decreases, it is difficult to prevent the short channel effect only through the formation of the LDD region. Accordingly, in order to obtain the threshold voltage (Vt) required in a highly integrated semiconductor device having a sub-100 nm level, a transistor structure having a recessed channel has been proposed in the art in place of a conventional transistor structure having a planar channel.

In the transistor structure having a recessed channel, the channel forming areas of an active region are recessed, and gates are formed in and over the recessed channel forming areas of the active region. In the transistor having the recessed channel, when compared to the conventional transistor having a planar channel, a channel length can be further increased in the same area, and thus, the short channel effect can be efficiently suppressed. Specifically, because the transistor having the recessed channel possesses a low junction field and a long channel length, the transistor can contribute to the increase in the margin of a semiconductor device.

However, in the transistor having the recessed channel, since the overlap area between a gate and an LDD region is increased when compared to the conventional transistor having a planar channel, a problem is caused in that gate-induced drain leakage (GIDL) increases.

FIG. 1 is a sectional view illustrating a transistor having a conventional recessed channel. Referring to FIG. 1, GIDL mainly occurs on the upper ends of the sidewalls of recesses. This is caused by the fact that the high doping concentration of an LDD region and the outward diffusion of a dopant from landing plugs act on the weak portions of a gate insulation layer (not shown) at the upper ends of the sidewalls of the recesses. The GIDL also occurs between passing gates and a device isolation structure, which serves as a factor for increasing leakage current, whereby the refresh characteristics of a semiconductor device can be deteriorated.

In FIG. 1, the reference numeral 108 designates junction areas including the LDD region, and 110 recess gates. Also, the reference character A designates the main occurrence positions of GIDL, and B designates the occurrence position of GIDL attributable to the passing gates 112.

Further, in the transistor having the recessed channel, when compared to the conventional transistor having a planar channel, since parasitic capacitance increases between a gate and a bit line and between a gate and a storage node contact owing to structural issues, a problem is caused in that a sensing margin decreases relatively.

In the meanwhile, the problems caused by the increase in the GIDL and the increase in the parasitic capacitance can be solved by a method of increasing the thickness of a gate oxide layer on the sidewall of the recess using the directionality in oxidation. However, in this case, since an effective oxide thickness increases and the amount of current decreases, the method cannot be actually adopted.

Also, the problems caused by the increase in the GIDL and the increase in the parasitic capacitance can be solved by a method of decreasing the concentration of the landing plug. This method employs a principle that, as the outward diffusion of a dopant from the landing plug is suppressed, an electric field is decreased. Nevertheless, in this case, while GIDL can be suppressed, because a depletion width increases due to the decrease in the concentration on a junction surface, and due to this, junction leakage and resistance increase, the method cannot also be actually adopted.

SUMMARY OF THE INVENTION

Embodiments of the present invention are directed to a semiconductor device which can reduce gate-induced drain leakage (GIDL) and parasitic capacitance and a method for manufacturing the same.

In one aspect, a semiconductor device comprises a semiconductor substrate having a device isolation structure for delimiting an active region, the active region being recessed and grooves being defined in channel forming areas of the active region; gates formed in and over the grooves; gate spacers formed on both sidewalls of the gates over portions of the recessed active region which are positioned on both sides of the gates; an LDD region formed in the active region under the gate spacers; junction areas formed in the active region on both sides of the gates including the gate spacers; and landing plugs formed on the junction areas.

A recessing depth of the active region is 200~1,000 Å.

Each landing plug has a stacked structure of a first conductive material which is filled in the recessed active region and a second conductive material which is filled between the gates on the first conductive material.

The first conductive material and the second conductive material comprise doped polysilicon layers.

The first conductive material made of the doped polysilicon layer has a doping concentration lower than that of the second conductive material made of the doped polysilicon layer.

In another aspect, a method for manufacturing a semiconductor device comprises the steps of forming a device isolation structure in a semiconductor substrate to delimit an active region; forming an LDD region in a surface of the active region; defining grooves in channel forming areas of the active region such that a bottom of each groove is positioned lower than a bottom of the LDD region; forming gates in and over the grooves; recessing a portion of the LDD region which corresponds to upper end portions of the grooves; forming gate spacers on both sidewalls of the gates over portions of the LDD region which are positioned on both sides of the gates; forming junction areas in the active region including the recessed LDD region on both sides of the gates including the gate spacers; and forming landing plugs on the junction areas.

A depth of the LDD region is 200~1,000 Å.

Each landing plug has a stacked structure of a first conductive material which is filled in the recessed active region and a second conductive material which is filled between the gates on the first conductive material.

The first conductive material and the second conductive material comprise doped polysilicon layers.

The first conductive material made of the doped polysilicon layer has a doping concentration lower than that of the second conductive material made of the doped polysilicon layer.

DESCRIPTION OF SPECIFIC EMBODIMENTS

In the present invention, by removing a portion of an LDD region corresponding to the upper ends of the sidewalls of recesses and forming gate spacers on both sides of gates in the removed portion of the LDD region, a semiconductor device including transistors, which have recessed channels, is realized.

By this fact, in the present invention, since a result that is the same as that obtained when the thickness of a gate insulation layer is increased on the upper ends of the sidewalls of recesses can be obtained, it is possible to efficiently prevent GIDL from occurring on the upper ends of the sidewalls of recesses and to decrease parasitic capacitance between a gate and a bit line and between the gate and a storage node contact.

Also, in the present invention, due to the fact that the unstable upper end edges of the recesses and damaged portions caused after implementing etching to form gates can be separated from recess gates without specifically changing the existing processes, the processes can be stabilized and the characteristics of a semiconductor device can be improved.

In addition, in the present invention, because an active region is partially removed after implementing a thermal process such as a gate oxidation process, the depth of a junction area can be maintained as it is, and according to this, the stable characteristics of a semiconductor device can be obtained.

Besides, in the present invention, since the outward diffusion of a dopant from a landing plug can be efficiently prevented, the concentration of the landing plug can be increased, and according to this, since contact resistance can be decreased, the characteristics of a semiconductor device can be further improved.

Hereafter, specific embodiments of the present invention will be described with reference to the attached drawings.

Figure 1:
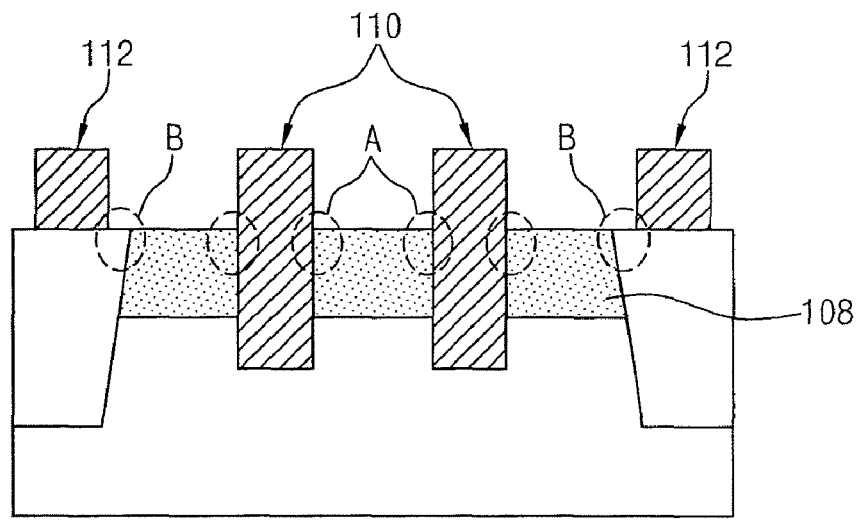
FIG. 1 is a sectional view illustrating a transistor having a conventional recessed channel.
Figure 2:
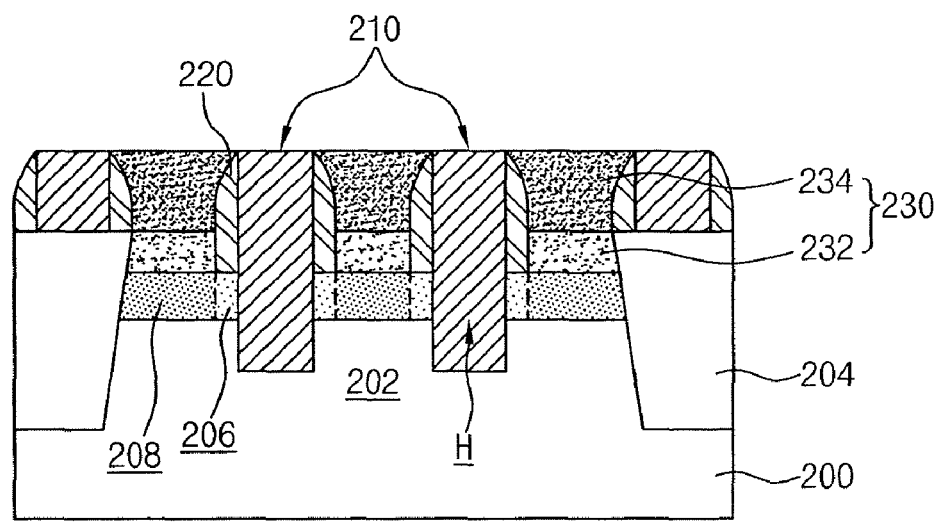
FIG. 2 is a sectional view illustrating a semiconductor device in accordance with an embodiment of the present invention.

FIG. 2 is a sectional view illustrating a semiconductor device in accordance with an embodiment of the present invention.

Referring to FIG. 2, a device isolation structure 204 is formed in a semiconductor substrate 200 to delimit an active region 202. The active region 202 is recessed to a predetermined depth. The active region 202 includes channel forming areas, and grooves H are defined in the channel forming areas.

Recess gates 210 are formed in and over the grooves H. While not concretely shown in the drawing, each of the recess gates 210 has a gate insulation layer formed on the surface of each groove H, a gate conductive layer formed on the gate insulation layer to fill the groove H, and a hard mask layer formed on the gate conductive layer and made of a nitride layer. The gate conductive layer comprises a stack of a polysilicon layer and a metal-based layer. The metal-based layer includes a metal layer, and in this case, it is preferred that a diffusion barrier be formed between the polysilicon layer and the metal layer.

Gate spacers 220 are formed on the sidewalls of the recess gate 210. An LDD region 206 is formed in the recessed portion of the active region 202 under the gate spacers 220. Junction areas 208 are formed in the surface of the active region 202 on both sides of the recess gate 210 including the gate spacers 220.

Landing plugs 230 are formed on the junction areas 208. The landing plugs 230 contain a first conductive material 232 which is filled in the recessed portion of the active region 202 and a second conductive material 234 which is filled between the recess gates 210 on the first conductive material 232. Preferably, the first and second conductive materials 232 and 234 are made of doped polysilicon. The first conductive material 232 made of doped polysilicon is formed to have a lower concentration than the second conductive material 234 made of doped polysilicon, such that the landing plugs 230 of the present invention have a two-staged concentration.

As described above, since the semiconductor device according to the present invention has a structure in which a partial thickness of an active region is recessed and gate spacers are formed on the sidewalls of each recess gate over the recessed portion of the active region, due to the presence of the gate spacers, it is possible to obtain the same result as that achieved when the thickness of a gate insulation layer is increased on the upper ends of the sidewalls of recesses. Accordingly, in the semiconductor device according to the present invention, the occurrence of GIDL on the upper ends of the sidewalls of the recesses is efficiently reduced, and the parasitic capacitance between the recess gate and a bit line and between the recess gate and a storage node contact can be efficiently decreased.

In addition, due to the fact that the semiconductor device according to the present invention has a structure in which the unstable upper end edges of the recesses and damaged portions caused after implementing etching to form gates are separated from the recess gates, the characteristics of the semiconductor device can be improved.

Besides, since the semiconductor device according to the present invention has a structure in which the outward diffusion of a dopant from a landing plug can be efficiently prevented, the concentration of the landing plug can be increased, and according to this, contact resistance can be decreased, whereby the characteristics of the semiconductor device can be further improved.

FIGS. 3A through 3F are sectional views illustrating the processes of a method for manufacturing a semiconductor device in accordance with another embodiment of the present invention.

Figure 3A:
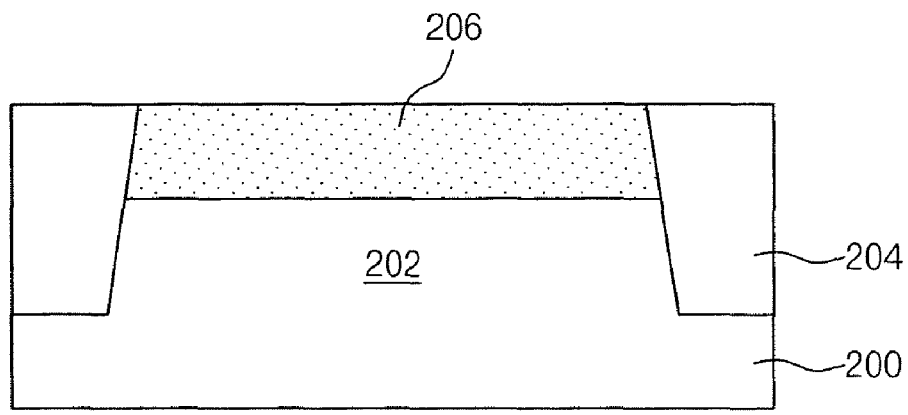
FIGS. 3A through 3F are sectional views illustrating the processes of a method for manufacturing a semiconductor device in accordance with another embodiment of the present invention.

Referring to FIG. 3A, a device isolation structure 204 is formed in a semiconductor substrate 200, for example, through a shallow trench isolation (STI) process, to delimit an active region 202. Ion implantation is implemented in the active region 202 delimited by the device isolation structure 204 with an aim of adjusting a threshold voltage, and then, by implementing LDD ion implantation, an LDD region 206 is formed in the surface of the active region 202.

Figure 3B:
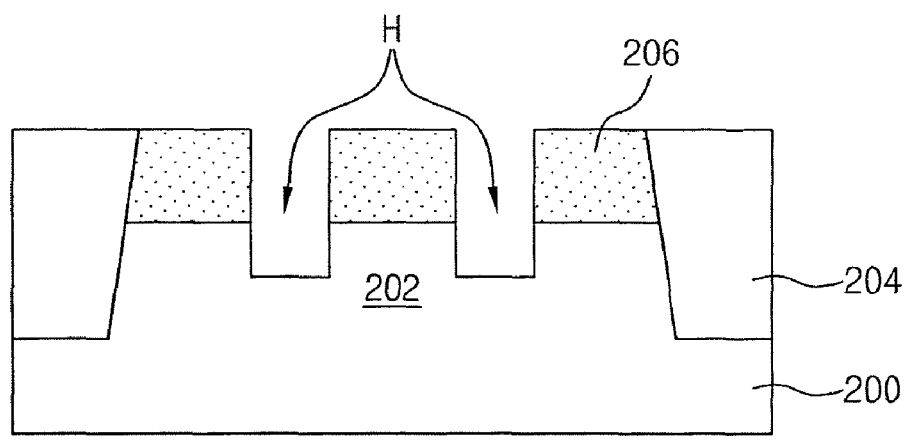

Referring to FIG. 3B, after forming a mask pattern (not shown) on the active region 202, on the surface of which the LDD region 206 is formed, and on the device isolation structure 204 to expose the channel forming areas in the active region 202, by etching the exposed channel forming areas of the active region 202 using the mask pattern as an etch mask, grooves H are defined. The grooves H are defined to have a depth that allows the bottom of each groove H to be positioned lower than the lower end of the LDD region 206. For example, in the case where the LDD region 206 is formed to a depth of 1,500~2,000 Å when measured from the surface of the active region 202, the groove H is defined to a depth of 3,000~4,000 Å.

Figure 3C:
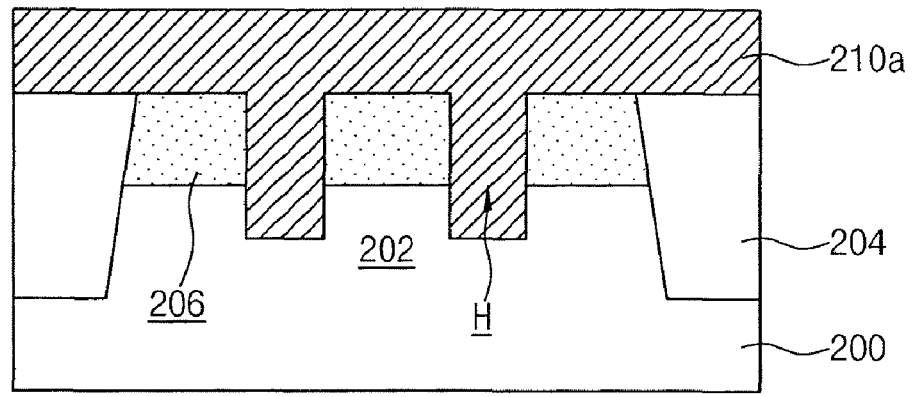

Referring to FIG. 3C, a gate insulation layer (not shown) is formed on the surface of the active region 202 including the surfaces of the grooves H, and a gate conductive layer 210a is formed on the gate insulation layer to fill the grooves H. The gate conductive layer 210a comprises a stack of a polysilicon layer and a metal-based layer. The metal-based layer includes a metal layer such as a tungsten layer, and in this case, it is preferred that a diffusion barrier (not shown) made of a tungsten silicide layer, a tungsten nitride layer, a titanium nitride layer or a tungsten silicon nitride layer be formed between the metal layer and the polysilicon layer. A hard mask layer (not shown) made of a nitride layer is formed on the gate conductive layer 210a.

Figure 3D:
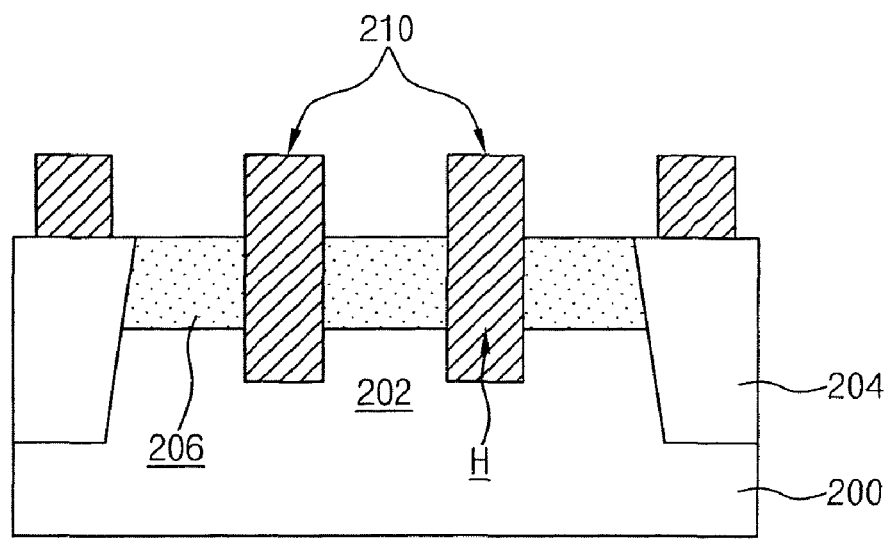

Referring to FIG. 3D, after forming a mask pattern (not shown) for delimiting gate forming areas on the hard mask layer, the hard mask layer is etched using the mask pattern. By etching the gate conductive layer 210a and the gate insulation layer using the etched hard mask layer as an etch mask, recess gates 210 are formed in and over the grooves H.

Figure 3E:
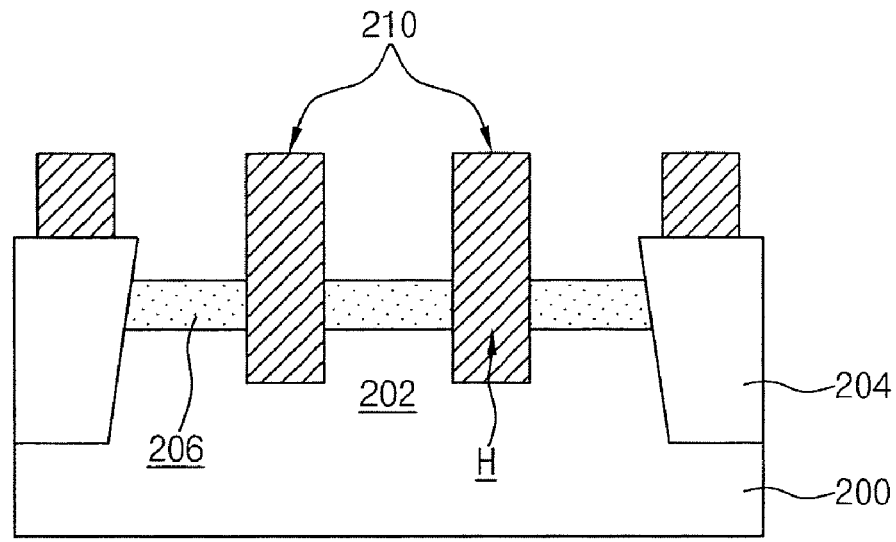

Referring to FIG. 3E, the surface of the active region 202, that is, the surface of the LDD region 206 is recessed to a predetermined depth using the recess gates 210 as an etch mask such that the portions of the LDD region 206 which correspond to the upper end portions of the sidewalls of the grooves H are removed. The recessing depth of the LDD region 206 is set, for example, to 200~1,000 Å. At this time, the device isolation structure 204 does not need to be etched, and the active region 202, that is, the surface of the LDD region 206 is selectively etched and thereby removed.

Here, in the present invention, since a partial thickness of the active region 202, that is, the LDD region 206, is removed after conducting a thermal process such as a gate oxidation process, the depth of junction areas, which are to be subsequently formed, can be maintained as it is. Therefore, in the present invention, the stable characteristics of a semiconductor device can be secured.

Figure 3F:
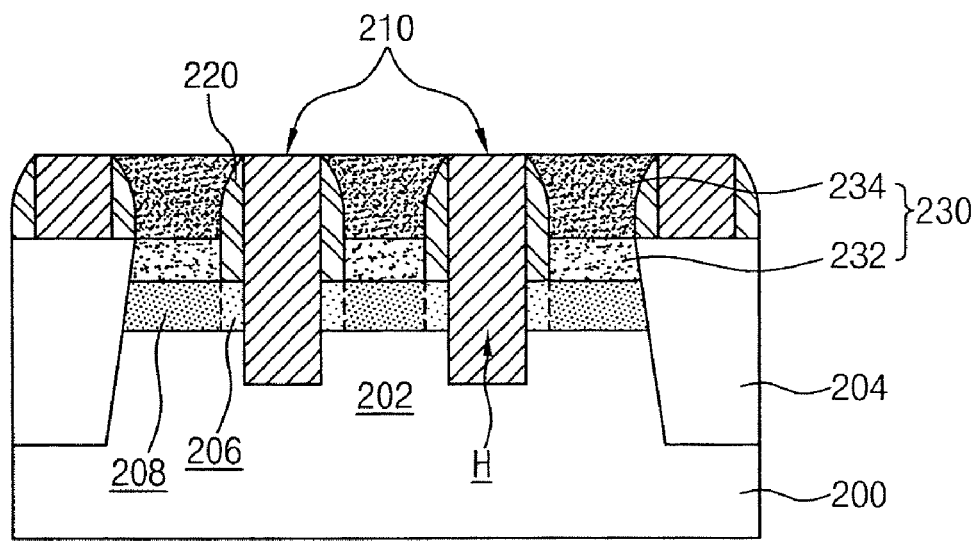

Referring to FIG. 3F, a spacer material layer is deposited on the recessed LDD region 206, the recess gates 210 and the device isolation structure 204. The spacer material layer, for example, comprises a nitride layer, a double layer of an oxide layer and a nitride layer, and a triple layer of an oxide layer, a nitride layer and an oxide layer. By etching the spacer material layer, gate spacers 220 are formed on both sidewalls of the recess gates 210 over the portions of the recessed LDD region 206 which are positioned on both sides of the recess gates 210. By implementing source and drain ion implantation into the resultant substrate which is formed with the gate spacers 220, junction areas 208 are formed in the surface of the active region 202 including the LDD region 206 on both sides of the recess gates 210 including the gate spacers 220, and through this, a transistor having recessed channels is formed.

Landing plugs 230 are formed over the junction areas 208 between the recess gates 210. Each of the landing plugs 230 includes a first conductive material 232 which is formed to fill the etched portion of the LDD region 206 and a second conductive material 234 which is formed on the first conductive material 232. Preferably, a doped polysilicon layer is used as the first and second conductive materials 232 and 234. At this time, in the present invention, the doping concentration of the first conductive material 232 made of a doped polysilicon layer is lower than the doping concentration of the second conductive material 234 made of a doped polysilicon layer so that the landing plugs 230 can have a two-staged concentration. In this case, in the present invention, since the outward diffusion of a dopant from the landing plugs 230 is suppressed without increasing resistance, GIDL can be reduced.

As is apparent from the above description, in the present invention, since GIDL and parasitic capacitance can be decreased without specifically changing the existing processes, the processes can be stabilized and the characteristics of a semiconductor device can be improved.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor device comprising:
a semiconductor substrate having a device isolation structure for delimiting an active region, the active region being recessed with respect to the device isolation structure so as to form a recessed active region, and grooves being defined in channel forming areas of the recessed active region;
gates formed in and over the grooves;
gate spacers formed on both sidewalls of the gates over portions of the recessed active region which are positioned on both sides of the gates;
an LDD region formed in the recessed active region under the gate spacers;
junction areas formed in the recessed active region on both sides of the gates including the gate spacers; and
landing plugs formed on the junction areas.

2. The semiconductor device according to claim 1, wherein a recessed depth of the recessed active region with respect to device isolation structure is 200-1,000 Å.

3. The semiconductor device according to claim 1, wherein each landing plug has a stacked structure of a first conductive material which is filled in the recessed active region and a second conductive material which is filled between the gates on the first conductive material.

4. The semiconductor device according to claim 3, wherein the first conductive material and the second conductive material comprise doped polysilicon layers.

5. The semiconductor device according to claim 4, wherein the first conductive material made of the doped polysilicon layer has a doping concentration lower than that of the second conductive material made of the doped polysilicon layer.

* * * * *